(12) United States Patent
Kwak (10) Patent No.: US 7,659,663 B2
(45) Date of Patent: Feb. 9, 2010

(54) ORGANIC LIGHT-EMITTING DISPLAY DEVICE AND METHOD FOR FABRICATING THE SAME

(75) Inventor: Won Kyu Kwak, Seongnam-si (KR)

(73) Assignee: Samsung Mobile Display Co., Ltd. (KR)

( * ) Notice: Subject to any disclaimer, the term of this patent is extended or adjusted under 35 U.S.C. 154(b) by 409 days.

(21) Appl. No.: 11/633,392

(22) Filed: Dec. 4, 2006

(65) Prior Publication Data

US 2007/0176550 A1    Aug. 2, 2007

(30) Foreign Application Priority Data

Jan. 27, 2006    (KR) ............. 10-2006-0008764

(51) Int. Cl.
  *H01J 1/62*    (2006.01)
(52) U.S. Cl. .................. 313/506; 313/512
(58) Field of Classification Search .......... 313/512, 313/498, 505, 506
  See application file for complete search history.

(56) References Cited

U.S. PATENT DOCUMENTS

| 6,555,025 | B1 | 4/2003 | Krupetsky et al. |
| 6,998,776 | B2 | 2/2006 | Aitken et al. |
| 2004/0072380 | A1 | 4/2004 | Yamazaki et al. |
| 2004/0075380 | A1 | 4/2004 | Takemoto et al. |
| 2004/0207314 | A1 | 10/2004 | Aitken et al. |
| 2005/0233885 | A1 | 10/2005 | Yoshida et al. |

FOREIGN PATENT DOCUMENTS

| CN | 1458640 A | 11/2003 |
| EP | 1296385 A2 | 3/2003 |
| EP | 1343206 A2 | 9/2003 |
| JP | 2004 139767 | 5/2004 |
| WO | WO 2004 095597 A2 | 11/2004 |

OTHER PUBLICATIONS

Search Report dated Aug. 1, 2007 in corresponding European patent application No. 07101230.
Office Action of related Chinese Patent Application No. 200710007711.1 with its English translation in 15 pages.
Office Action dated Sep. 15, 2009 of the Japanese Patent Application No. 2006-200751.

*Primary Examiner*—Vip Patel
(74) *Attorney, Agent, or Firm*—Knobbe Martens Olson & Bear LLP (57) ABSTRACT

Disclosed is an organic light-emitting display device capable of blocking the infiltration of oxygen and moisture, etc. by encapsulating an array of pixels by interconnecting first and second substrates with a frit. The organic light-emitting display device includes a first substrate, a second substrate opposing the first substrate, an array of pixels interposed between the first and second substrates, and a frit positioned between the first and the second substrate to adhere the first substrate to the second substrate. The frit is formed to overlap with at least a part of scan drivers.

13 Claims, 7 Drawing Sheets

ORGANIC LIGHT-EMITTING DISPLAY DEVICE AND METHOD FOR FABRICATING THE SAME

CROSS-REFERENCE TO RELATED APPLICATIONS

This application claims the benefit of Korean Patent Application No. 10-2006-0008764, filed Jan. 27, 2006, in the Korean Intellectual Property Office, the disclosure of which is incorporated herein by reference in its entirety.

BACKGROUND

1. Field of the Invention

The present invention relates to an organic light-emitting display device, and more particularly, to encapsulating an organic light-emitting display device.

2. Discussion of Related Technology

An organic light-emitting display device is one sort of flat display devices wherein an organic light-emitting layer is positioned between electrodes opposed to each other and voltage is then applied between the electrodes so that holes and electrons injected from the respective electrodes to an organic light-emitting layer are coupled, and the exciting molecules thus generated are returned to a base state, thereby, light-emitting the emitted energy as light.

The organic light-emitting display device as above is excellent in view of light-emitting efficiency, brightness, view angle and a response speed and can be fabricated in light weight and thinness and therefore, has been spotlighted as a next generation display. The organic light-emitting display device requires the encapsulation of the array of pixels. U.S. Pat. Publication No. 6,998,776 discloses a structure to encapsulate the pixel region by applying a frit to a glass substrate.

The discussion in this section is to provide general background information, and does not constitute an admission of prior art.

SUMMARY

An aspect of the invention provides an organic light emitting display device, which may comprise: a first substrate; a second substrate opposing the first substrate; an array of organic light emitting pixels interposed between the first and second substrates; a scan driver interposed between the first substrate and the second substrate; and a frit seal comprising a plurality of elongated segments interposed between the first and the second substrates, the plurality of elongated segments in combination surrounding the array, the plurality of elongated segments comprising a first elongated segment extending generally in a first direction, wherein the first elongated segment overlaps with the scan driver when viewed in a second direction from the first substrate, wherein the second direction defines the shortest distance between the first and second substrates, wherein the first elongated segment comprises a first portion and a second portion, the first portion being interposed between the scan driver and the second substrate, the second portion being interposed between the first substrate and the second substrate while not interposed between the scan driver and the second substrate, wherein the second portion comprises a first end and a second end, the first end contacting the first substrate, the second end contacting the second substrate, wherein the first end is bonded to the first substrate.

In the foregoing device, the scan driver may comprise electric circuits and a layer covering the electric circuits, wherein the first portion may comprise a first end and a second end. At least part of the first end may contact the layer. At least part of the first end may not contact the layer. At least part of the first end may not be bonded to the layer. The second end of the first portion may contact and be bonded to the first substrate. The layer may not be made of frit or glass. The second end of the first portion and the second end of the second portion may form a surface substantially free of a step between the first and second portions. The first and second portions may be a single piece. The first end of the first portion and the first end of the second portion may form a step between the first and second portions. The first portion may be interior to the second portion. The scan driver may have a portion which does not overlap with the first elongated segment when viewed from the first substrate in the second direction. The frit seal may be configured to substantially inhibit visible light from passing therethrough.

Another aspect of the invention provides a method of making an organic light emitting display device, which may comprise: providing an unfinished product, the product comprising: a first substrate; a second substrate opposing the first substrate; an array of organic light emitting pixels interposed between the first and second substrates; a scan driver interposed between the first and second substrates; and a frit comprising a plurality of elongated segments interposed between the first and the second substrates, the plurality of elongated segments in combination surrounding the array, the plurality of elongated segments comprising a first elongated segment extending generally in a first direction, wherein the first elongated segment overlaps with the scan driver when viewed in a second direction from the first substrate, wherein the second direction defines the shortest distance between the first and second substrates, wherein the first elongated segment comprises a first portion and a second portion, the first portion being interposed between the scan driver and the second substrate, the second portion being interposed between the first substrate and the second substrate while not interposed between the scan driver and the second substrate; and applying a laser beam to the second portion of the first elongated portion such that the frit interconnects the first substrate and second substrate, wherein the second portion comprises a first end and a second end, the first end contacting the first substrate, the second end contacting the second substrate, wherein the first end is bonded to the first substrate.

In the foregoing method, the scan driver may comprise electric circuits and a layer covering the electric circuits, wherein the first portion may comprise a first end and a second end. At least part of the first end may contact the layer. At least part of the first end may not contact the layer. At least part of the first end may not be bonded to the layer. The second end of the first portion may contact and be bonded to the first substrate. The layer may not be made of frit or glass.

An aspect of the present invention provides an organic light-emitting display device and method for fabricating the same, capable of blocking the infiltration of oxygen and moisture, etc., by encapsulating a first substrate and a second substrate with a frit, and effectively preventing light leakage.

An aspect of the present invention provides a top emission type organic light-emitting display device comprising: a first substrate comprising a pixel region in which a plurality of organic light-emitting diodes are provided and a non-pixel region in which scan drivers for supplying a driving signal to the pixel region are provided; a second substrate disposed on the upper part of the first substrate to be overlapped with the pixel region and at least one region of the non-pixel region; and a frit positioned between the first and the second substrate to adhere the first substrate to the second substrate, wherein the frit is formed to be overlapped with at least a part of the non-pixel region including at least one region on the scan drivers. The frit includes glass material, absorbent for absorbing laser or infrared rays, and a filler for reducing thermal expansion coefficient.

Among the frits, the frit corresponding to the edges of the first and the second substrates on which elements are not formed is formed to be thicker than the frit overlapped with the scan drivers, and the first and the second substrates are adhered to each other by means of the frit in the part corresponding to the edges of the first and the second substrates. The second substrate is set to be an etched glass wherein the thickness of the center part thereof is thinner than that of the edge thereof. The thickness of the frit corresponding to the edge parts of the first and the second substrates is set to be the same with that of the frit overlapped with the scan drivers.

An aspect of the present invention provides a method for fabricating a top emission type organic light-emitting display device comprising a first substrate comprising: a pixel region in which organic light-emitting diodes are provided and a non-pixel region in which scan drivers are provided, and a second substrate disposed on the upper part of the first substrate to be overlapped with the pixel region and at least one region of the non-pixel region, the method comprising the steps of: forming a frit by applying and burning frit paste to at least one of the first and the second substrates to correspond to the non-pixel region including at least one region on the scan drivers; bonding the first substrate to the second substrate; and adhering the first substrate to the second substrate by irradiating laser or infrared rays to at least one region of the frit formed between the first substrate and the second substrate.

The frit other than the frit overlapped with the scan driver among the frits is irradiated by laser or infrared rays. The wavelength of laser and infrared rays are set to be from about 800 nm to about 1200 nm. The frit irradiated by laser or infrared rays is formed to be thicker than the frit overlapped with the scan drivers. In the step of irradiating laser or infrared rays, the frit formed to be overlapped with the scan drivers and the region in which elements including the pixel region are formed are masked. A frit paste including absorbent absorbing laser or infrared rays is applied. The frit is melted by absorbing laser or infrared rays and is thus adhered to the first and the second substrates. The burning temperature of the frit paste is set to be from about 300° C. to about 500° C. The frit paste is applied to the second substrate.

BRIEF DESCRIPTION OF THE DRAWINGS

These and other aspects and advantages of the invention will become apparent and more readily appreciated from the following description of the embodiments, taken in conjunction with the accompanying drawings of which.

DETAILED DESCRIPTION OF EMBODIMENTS

Hereinafter, various embodiments of the present invention will be described in a more detailed manner with reference to the accompanying drawings.

An organic light emitting display (OLED) is a display device, comprising an array of organic light emitting diodes. Organic light emitting diodes are solid state devices which include an organic material and are adapted to generate and emit light when appropriate electrical potentials are applied.

Figure 7A:
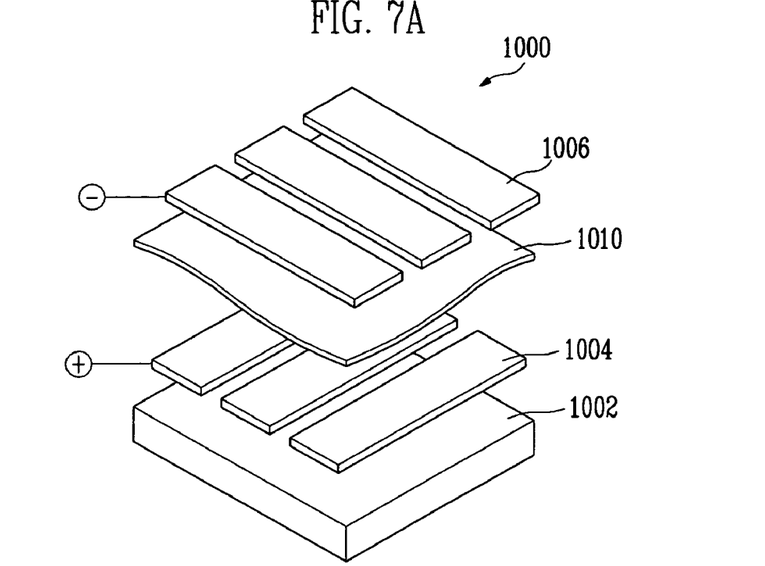
FIG. 7A is a schematic exploded view of a passive matrix type organic light emitting display device in accordance with one embodiment.
Figure 7B:
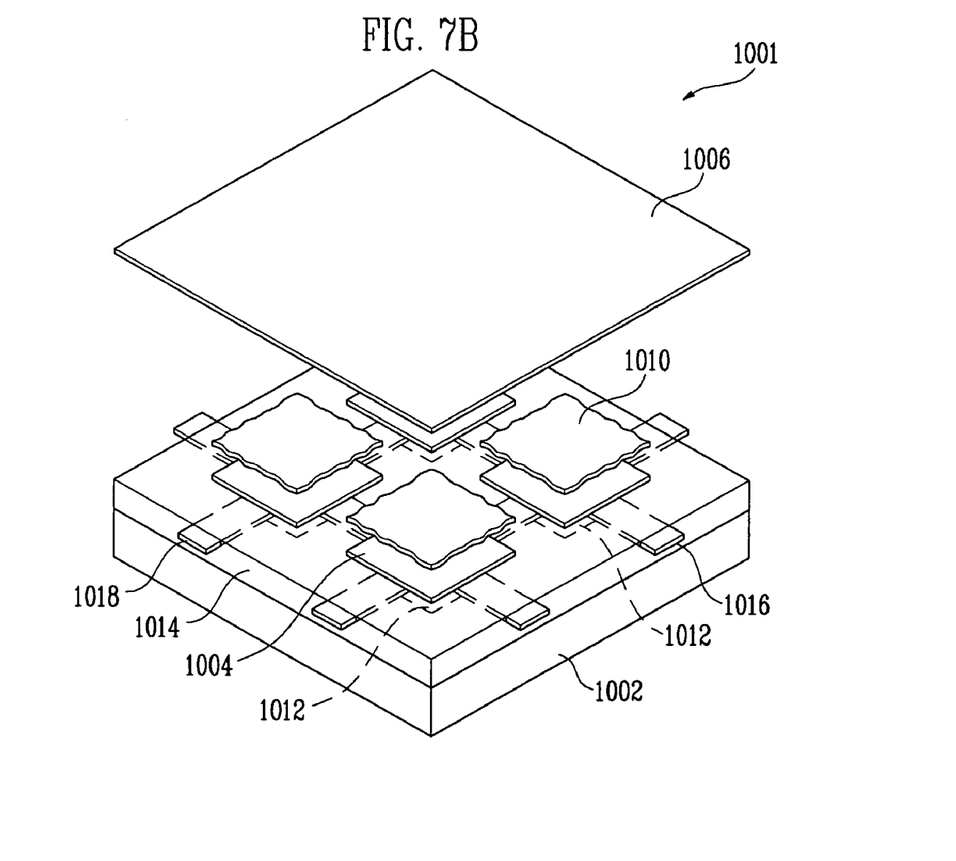
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel an-ay and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (CFT) and arranged in a grid or array under the OLED pixel array. The local driving circuits 1012 may be at least partly made of organic materials, including organic TFT.

AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
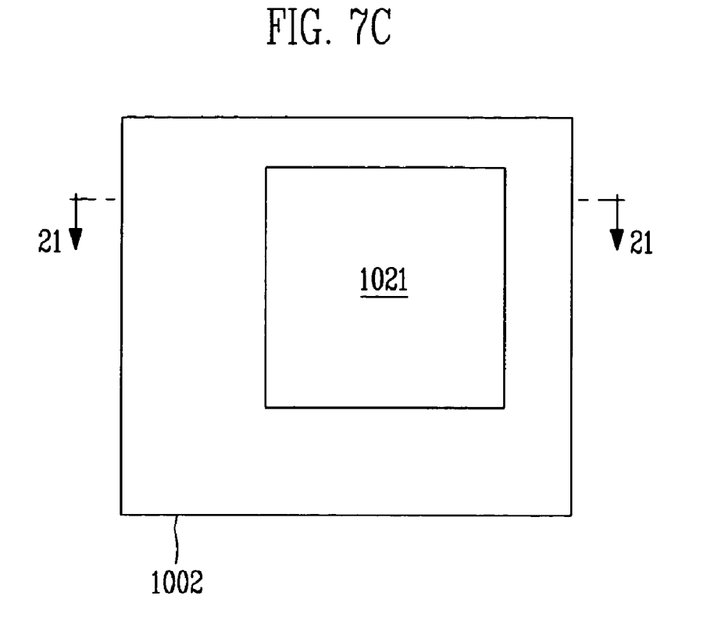
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
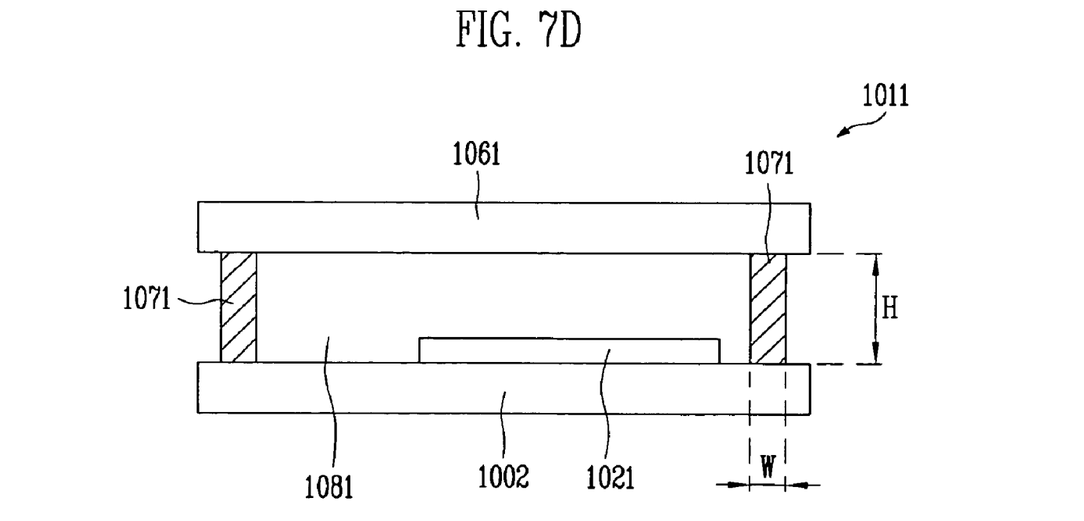
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 107i has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a ftit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
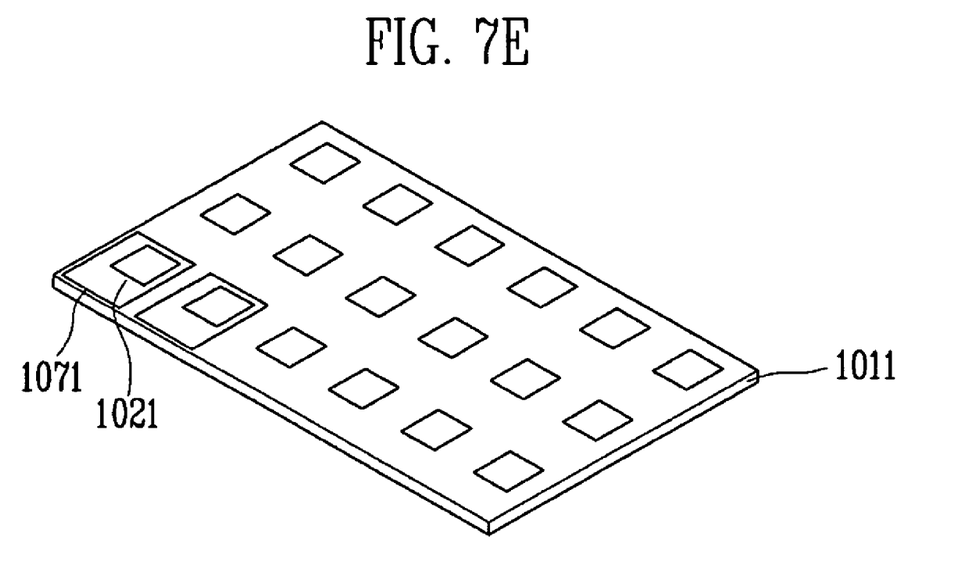
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

Figure 1:
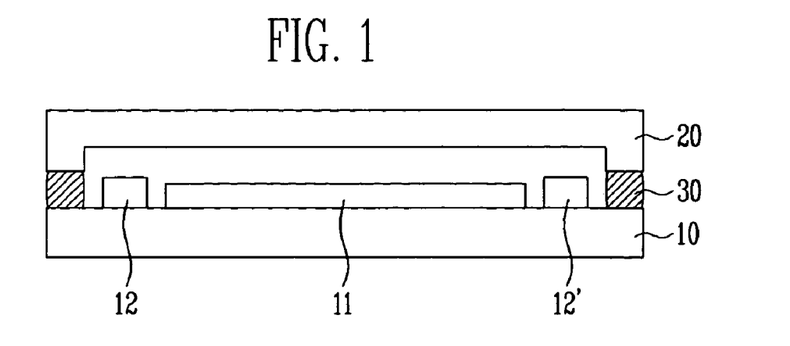
FIG. 1 is a cross-sectional view of a general organic light-emitting display device.

FIG. 1 is a cross-sectional view of a general organic light-emitting display device. Referring to FIG. 1, an exemplary organic light-emitting display device is configured including a first substrate 10 and a second substrate 20 positioned to be opposed to each other, and the first and the second substrates 10 and 20 are adhered to each other with encapsulating material 30 and the inner side thereof is thus encapsulated. The first substrate 10 is a substrate comprising a pixel region 11 and a driving circuit such as scan drivers 12 and 12' thereon, wherein the pixel region 11 is provided with a plurality of pixels having at least one organic light-emitting diode (not shown); and the driving circuit is provided in a non-pixel region which is the region other than the pixel region 11. The second substrate 20 is adhered to be opposed to the side of the first substrate 10 on which the pixel region 11 and the scan driver 12 and 12' are formed. The second substrate 20 as above is adhered to the first substrate 10 so that at least one region of the first substrate 10, in particular, the pixel region 1 I is encapsulated. The encapsulating material 30, which is configured including epoxy resin, is applied along the edge of the first substrate 10 and the second substrate 20, is melted by the irradiation of ultraviolet rays, etc. and is thus cured, adhering the first substrate 10 to the second substrate 20. The encapsulating material as above is to prevent the infiltration of oxygen and moisture, etc. into the pixel region 11, etc. positioned in the encapsulated space between the first substrate 10 and the second substrate 20.

However, even though the encapsulating material 30 is applied, the infiltration of oxygen and moisture, etc. through fine cracks cannot be completely blocked. In order to prevent this, in the moisture absorbent (not shown), etc., which is coated on the sealing substrate 20 and is then burned, has been used. However, the adhesion between the encapsulating material 30 and the substrates 10 and 20 is deteriorated due to outgassing generated when the moisture absorbent is burned, causing a problem that the pixel region 11 is easily exposed to oxygen and moisture. The frit as above is tinged with black absorbing and blocking light and therefore, can function as a black matrix, BM, preventing light leakage. The light leakage is the phenomenon to be hazily seen due to the reflection of light by means of external light in the non-pixel region, causing a problem that the image quality is deteriorated when the light leakage is generated. However, the frit is applied to only the most-outer edge of the region to be encapsulated, that is, the part on which an element is not formed, ineffectively preventing the light leakage. Thereby, there has been a problem that the phenomenon of the light leakage is still frequently occurred in the non-pixel region adjacent to the pixel region 105. Therefore, there is a need that the scheme for effectively preventing the light leakage should be devised, while encapsulating the first substrate 10 and the second substrate 20 with the frit in order to block the infiltration of oxygen and moisture into the space between the-two substrates.

Figure 2:
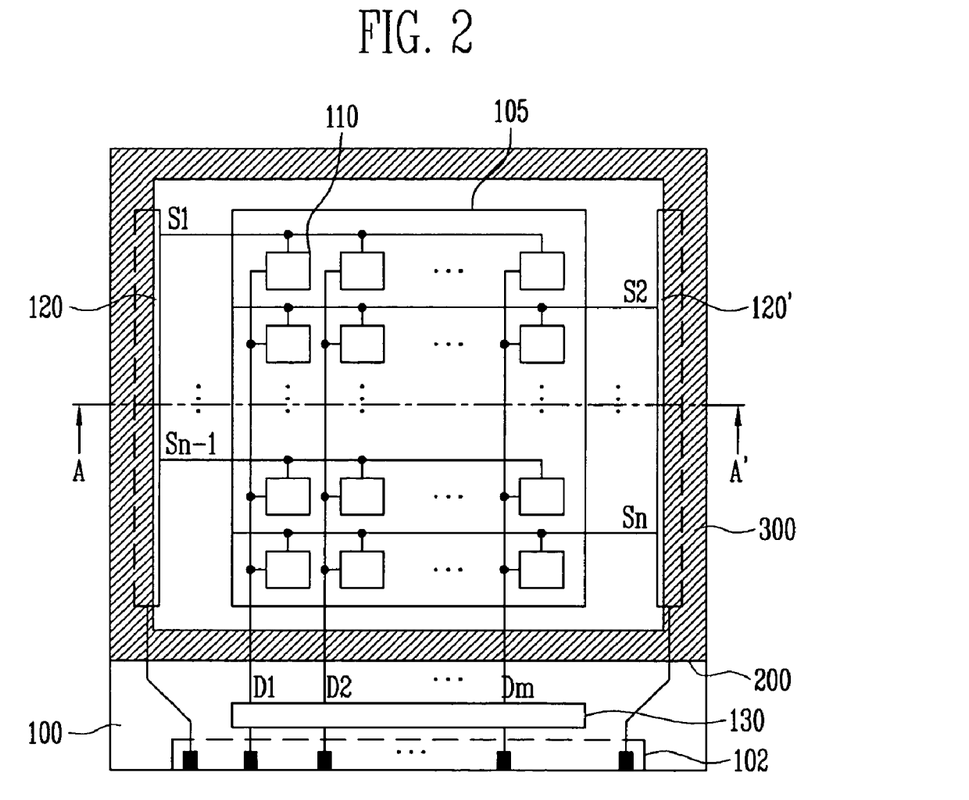
FIG. 2 is a plan view of an organic light-emitting display device according to the embodiment of the present invention.
Figure 3:
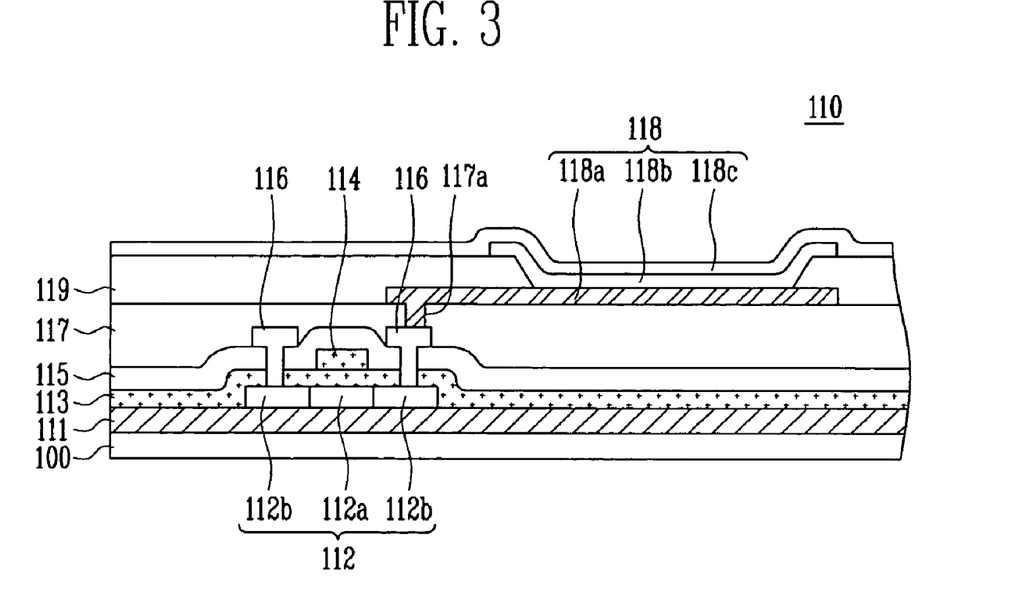
FIG. 3 is a cross-sectional view of main parts of the pixel shown in FIG. 2.

FIG. 2 is a plan view showing an organic light-emitting display device according to an embodiment of the present invention. And, FIG. 3 is a cross-sectional view of main parts of the pixel shown in FIG. 2. FIG. 2 and FIG. 3 show an active matrix organic light-emitting display device wherein each pixel is provided with at least one thin film transistor and an organic light-emitting diode, although not limited thereto.

Referring to FIG. 2 and FIG. 3, an organic light-emitting display device according to an embodiment of the present invention comprises: a first substrate 100; and a second substrate 200 disposed on the upper part of the first substrate to be overlapped with at least one region of the first substrate 100, and the first substrate 100 and the second substrate 200 are adhered to each other by means of a f*it 300 applied along the edges therebettween.

On the first substrate 100 a pixel region 105 wherein a plurality of pixels 110 are provided; scan drivers 120 and 120' and a data driver 130 for supplying a driving signal to the pixels 110; and a pad part 102 for supplying a control signal to the scan drivers 120 and 120' and the data driver 130 are formed. The pixel region 105 means the region that scan lines (S1 to Sn) arranged in a row direction, data lines (D1 to Dm) arranged in a column direction and a plurality of pixels 110 positioned at the point on which the scan lines (S1 to Sn) are intersected with the data lines (D1 to Dm) are formed. The respective pixels 110 generate light having predetermined brightness corresponding to the scan signal supplied to the scan lines (S1 to Sn) and the data signal supplied to the data lines (D1 to Dm). Thereby, a predetermined image is displayed in the pixel region 105.

Here, each pixel 110 includes an organic light-emitting diode 118, which is a self light emission element, and at least one thin film transistor connected to the organic light-emitting diode 118, as shown in FIG. 3. However, although the structure of the pixel 110 is an active matrix organic light-emitting display device, the structure thereof can be variously modified in a passive matrix organic light-emitting display device.

The thin film transistor comprises: a buffer layer 111 formed on the first substrate 100; a semiconductor layer 112 formed on the buffer layer 111 and including a channel region 112a and a source and a drain regions 112b; a gate insulating film 113 formed on the semiconductor layer 112; a gate electrode 114 formed on the gate insulating film 113; an interlayer insulating film 115 formed on the gate electrode 114; a source and a drain electrodes 116 formed on the interlayer insulating film 115 and connected to the source and drain regions 112b. On the thin film transistor as above a planarization film 117 having a via hole 117a exposing at least one region of the drain electrode is formed.

And, on the planarization film 117 the organic light-emitting diode 118 connected to the thin film transistor through the via hole 117a is formed. The organic light-emitting diode 118 comprises a first electrode 118a and a second electrode 118c, and an organic light-emitting layer 118b positioned therebetween. The first electrode 118a is formed on the planarization film 117 and is connected to the drain electrode of the thin film transistor through the via hole 117a. In the case of the pixel 110 light-emitted from its top, the first electrode 118a as above can be configured including a reflection layer, which is not shown. On the first electrode 118a as above a pixel defined film 119 having an opening portion exposing at least a part of the first electrode 118a is formed, and the organic light-emitting layer 118b is formed in the opening portion of the pixel defined film 119. And, on the organic light-emitting layer 118b the second electrode 118c is formed. At this time, on the second electrode 118c as above a passivation layer, etc., which is not shown, can further be formed. The organic light-emitting diode 118 as above generate light having predetermined brightness corresponding to the current supplied from the thin film transistor.

In the non-pixel region other than the pixel region 105 scan drivers 120 and 120', a data driver 130, and a pad part 102 are formed. The scan drivers 120 and 120' generate a scan signal corresponding to the control signals supplied from the pad part 102 and supply it to scan lines (S1 to Sn). Here, two scan drivers 120 and 120', which are formed on both sides of the pixel region 105, supply the scan signal to the scan lines (S1, S3, . . . , Sn-1) in odd order and the scan lines (S2, S4, . . . , Sn) in even order, respectively. However, the structure of the scan drivers. 120 and 120' is not limited thereto and can be variously modified. The data driver 130 generates a data signal corresponding to data and control signals supplied from the pad part 102, and supplies it to data lines (D1 to Dm). The pad part 102 supplies the control signals supplied from the external to the scan drivers 120 and 120' and the data driver 130.

The second substrate 200 is disposed on at least one region of the first substrate 100 to be opposed to the side thereof on which the pixel region 105 and the scan drivers 120 and 120' are formed. Here, the pixels 110 formed on the first substrate 100 include the organic light-emitting layer 118a of the organic light-emitting diode 118, etc., resulting in that it can be easily deteriorated when oxygen and moisture infiltrate. Therefore, in order to prevent an infiltration of oxygen and moisture into the pixel region 105, the second substrate 200 is adhered to encapsulate the pixel region 105. And, in FIG. 2 the second substrate 200 is configured to be encapsulated, including the scan drivers 120 and 120', although is not limited thereto. That is, the second substrate 200 is disposed on the upper part of the first substrate 100 to be overlapped with the pixel region 105 and at least a part of the non-pixel region, and is then adhered to the first substrate 100 by means of the frit 300. Assuming that the devices according to embodiments of the present invention are the top emission type organic light-emitting display devices, the second substrate 200 is made of transparent material.

The frit 300 is applied to the edge of the second substrate 200 and is then positioned to be overlapped with the non-pixel region of the first substrate 100, encapsulating the pixel region 105. Here, the frit 300 means originally means glass raw material including additives in the form of a powder, however, in the glass technical field it may commonly means glass formed by melting the frit, and therefore, in embodiments of the present invention it means both of them. The frit 300 as above completely encapsulates the space between the first and the second substrates 100 and 200, effectively blocking an infiltration of oxygen and moisture. Also, the frit, which is made of material including transition metal, can be tinged with black preventing light from being passed through, functioning as the black matrix (BM) preventing the light leakage. However, when the frit 300 is formed only in the most-outer edge of the part in which the two substrates are bonded, the light leakage cannot be effectively prevented, and therefore, in embodiments of the present invention the frit, 300 is applied to the part adjacent to the pixel region 105, for example, to the upper part of the scan drivers 120 and 120'. That is, the frit is used as only additives for encapsulating the two substrates by applying the frit to the extreme contour of the encapsulated region in which an element is not formed, in embodiments of the present invention the frit 300 is applied even to the scan drivers 120 and 120' adjacent to the pixel region 105 and is thus used as the encapsulating material as well as the black matrix, effectively blocking the light leakage. Here, the detailed explanation of the encapsulating method by applying the frit 300 will be described below.

Figure 4:
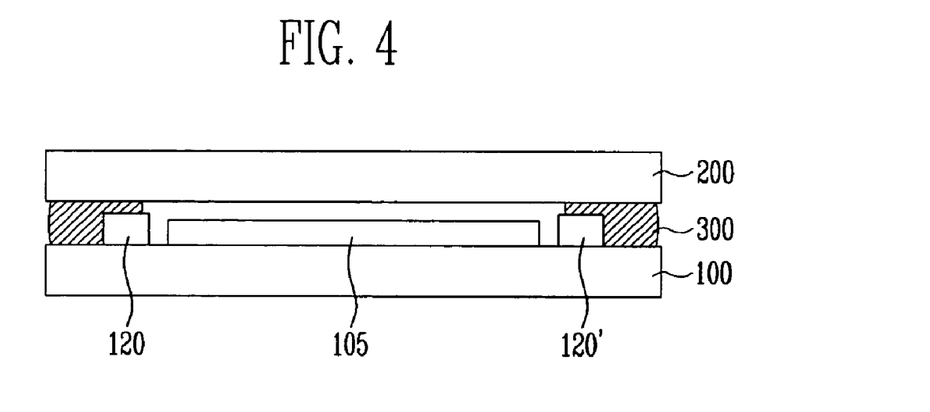
FIG. 4 and FIG. 5 are cross-sectional views of an organic light-emitting display device taken along A-A' line in FIG. 2.

FIG. 4 is a cross-sectional view of an organic light-emitting display device taken along A-A' line in FIG. 2. Referring to FIG. 4, the pixel region 105 formed on the first substrate 100 is completely encapsulated by the second substrate 200 and the frit 300. Here, the frit 300 that is material tinged with black is positioned in the edges of the first and the second substrates 100 and 200 as well as on the scan drivers 120 and 120' adjacent to the pixel region 105, effectively blocking the light leakage into the non-pixel region. Here, the frit 300 formed in the edge part in which elements are not formed is formed to be thicker than the frit 300 positioned on the scan drivers 120 and 120'. However, in certain embodiments, the frit 300 is formed in at least one region of the non-pixel region including the upper part of the scan drivers 120 and 120' is applied to the organic light-emitting display device light-emitting from its front, and the top emission type organic light-emitting display device displays a predetermined image on the top of the pixel region 105, the frit 300 should not be positioned in the pixel region 105.

Here, the frit 300, which is configured including glass material, absorbent for absorbing laser, and a filler for reducing thermal expansion coefficient, is applied to the second substrate 200 in a frit paste state and is cured; and is melted between the first and the second substrates 100 and 200 by laser or infrared rays and is cured again, adhering the first substrate 100 to the second substrate 200. At this time, if laser or infrared rays is irradiated to even the frit 300 positioned on the scan drivers 120 and 120', the internal circuit of the scan drivers 120 and 120' can be damaged. Therefore, laser or infrared rays should be irradiated to only the frit 300 applied to the part in which elements are not formed. That is, the frit 300 positioned in the edge in which elements are not formed is melted and cured again by absorbing laser or infrared rays so that it adheres and encapsulates the first and the second substrates 100 and 200. Meanwhile, the frit 300 applied to the scan drivers 120 and 120' is not adhered to the scan drivers 120 and 120', not functioning as adhesion but functioning only as the black matrix preventing the light leakage into the outer circumference of the pixel region 105, that is, the non-pixel region. Here, the frit 300 in the edge part adhered to the first and the second substrates 100 and 200 is formed to be thicker than the frit 300 overlapped with the scan drivers 120 and 120'.

Meanwhile, FIG. 4 shows the second substrate 200 as a bare glass of a flat panel type, however, the second substrate 200 can be set to be an etched glass wherein the thickness of the center part thereof is thinner than that of the edge part thereof. In this case, the, frit 300 in the edge part adhered to the first and the second substrate 100 and 200 and the frit 300 in the part overlapped with the scan drivers 120 and 120' can be formed in the same thickness.

Hereinafter, referring to FIG. 6a to FIG. 6d, the method for fabricating the organic light-emitting display device shown in FIG. 4 will be described in detail. For convenience, although FIG. 6a to FIG. 6d show the method for fabricating the individual organic light-emitting display device, in fact a plurality of display device cells can be fabricated in sheet unit. Referring to FIG. 6a to FIG. 6d, the frit 300 is applied to the edge of the second substrate 200. The frit 300 is applied to at least one region of the non-pixel region not to be overlapped with the pixel region 105 of the first substrate 100 described below. At this time, the frit 300 is applied in a shape corresponding to the edge of the first substrate 100 and the scan drivers 120 and 120' so that it can also be positioned on the scan drivers 120 and 120' formed on the first substrate 100. That is, the edge part of the frit 300 is applied to be thicker than the part to be overlapped with the scan drivers 120 and 120'.

Figure 6A:
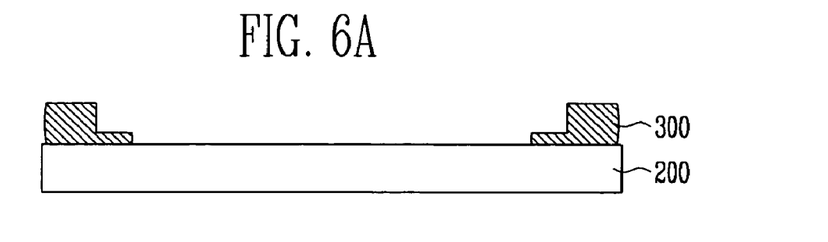
FIG. 6a to FIG. 6d are cross-sectional views showing the fabricating process of the organic light-emitting display device shown in FIG. 4.

The frit 306 as above is applied to the second substrate 200 in a frit paste state and burned, being cured after moisture or organic binder included in the paste is removed. Here, the frit paste is fabricated in a gel state by adding oxide powder and organic substance into glass powder and the burning temperature of the frit paste 300 is preferably set to be from about 300° C. to about 500° C. And, the thickness of the frit 300 may be from about 10 to about 20 μm (FIG. 6a).

Figure 6B:
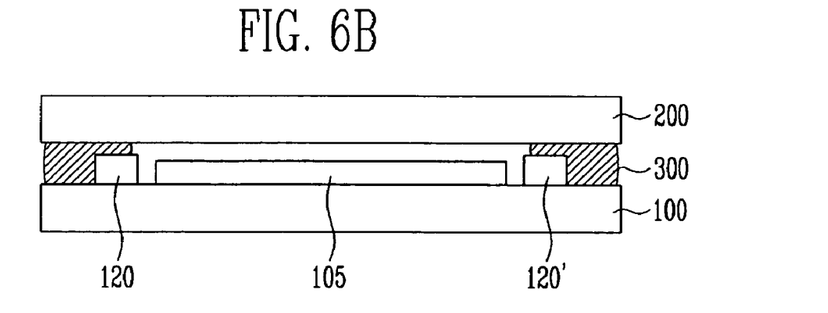

Thereafter, the first substrate 100 on which the pixel region 105 and the scan drivers 120 and 120' are formed is prepared, and the first substrate 100 and the second substrate 200 is adhered to each other so that the pixel region 105 is encapsulated. At this time, the frit 300 is positioned on the edges between the first and the second substrates 100 and 200 opposed to each other and the scan drivers 120 and 120', and is positioned not to be overlapped with the pixel region 105 (FIG. 6b).

Figure 6C:
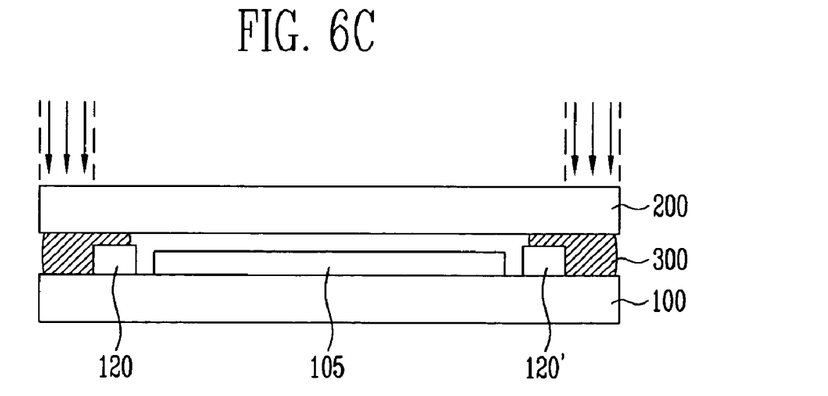
Figure 6D:
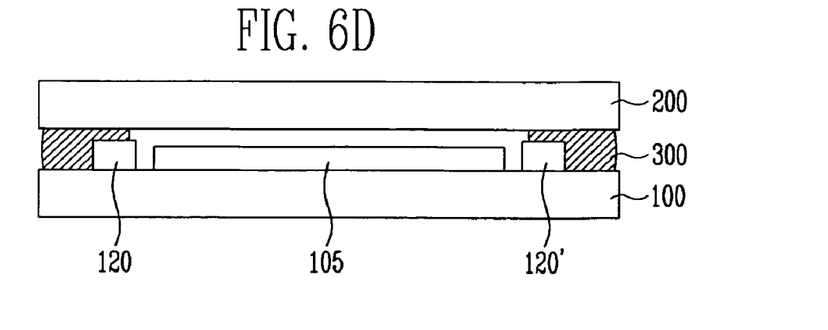

Thereafter, laser or infrared rays is irradiated to the part in which no elements are formed, that is, the frit 300 positioned in the edges between the first and the second substrates 100 and 200. And then, the frit 300, to which laser or infrared rays is irradiated, is melted by absorbing laser or infrared rays. At this time, it is preferable that the wavelength of laser or infrared rays is set to be from about 800 nm to about 1200 nm (preferably, about 810 nm), the beam size is set to be from about 1.0 nm to about 3.0 nm in diameter, the output electric power is set to be from about 25 watt to about 45 watt, and the part to which laser or infrared rays is not irradiated is to be masked. That is, the parts adjacent to the pixel region 105, in particular, the frit 300 formed to be overlapped with the scan drivers 120 and 120' and the pixel region 105, and the wirings (not shown) positioned between the scan drivers 120 and 120' and the pixel region 105 are masked not to be irradiated by laser or infrared rays, so that the wirings and the elements are prevented from being modified by laser or infrared rays. As material for masking, a double film of copper and aluminum can be used (FIG. 6c). Thereafter, the frit 300 melted by laser or infrared rays is cured again so that it adheres the first substrate 100 to the second substrate 200 (FIG. 6d).

Figure 5:
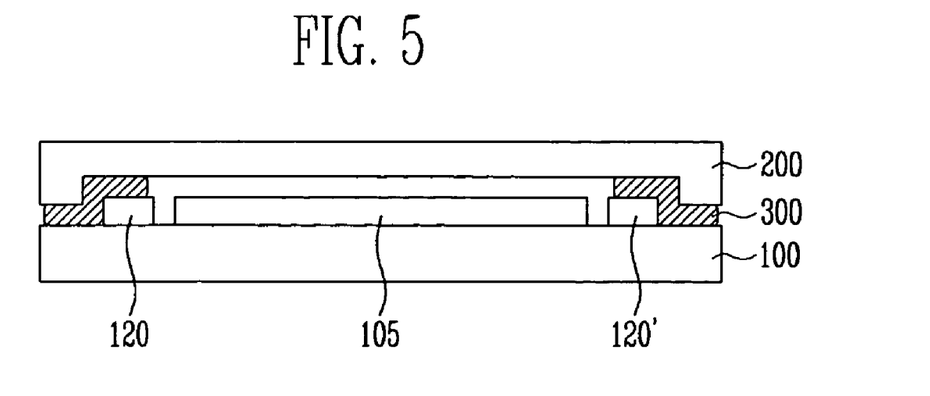

Meanwhile, the first and the second substrates 100 and 200 are adhered by applying the frit 300 to the second substrate 200 in the fabricating process as described before, although not limited thereto. For example, the frit 300 can first be applied to the first substrate 100 on which the pixel region 105 is formed, or can be applied to both the first and the second substrates 100 and 200, adhering the first and the second substrates 100 and 200. Also, when the second substrate 200 is set to be an etched substrate as shown in FIG. 5, the frit 300 can be applied to the second substrate 200 in the same thickness so that it corresponds to the edge of the first substrate 100 and the scan drivers 120 and 120'.

In the organic light-emitting display device and the method for fabricating the same as described before, the first and the second substrates 100 and 200 are adhered by means of the frit 300, resulting in that the infiltration of oxygen and moisture, etc. into the internal space including the pixel region 105 can be effectively blocked.-Also, the frit 300 tinged with black is also formed on the upper part of the scan drivers 120 and 120' adjacent to the pixel region 105 and is thus functioned as the black matrix, improving image quality by effectively preventing the light leakage into the non-pixel region. And, laser or infrared rays is not irradiated to the part in which elements such as the scan drivers 120 and 120', etc. can be formed but irradiated to only the edge part of the frit 300 wherein elements are not formed, preventing the modification of the elements.

As described above, according to the organic light-emitting display device and the method for fabricating the same, the first and the second substrates are adhered by means of the frit 300, resulting in that the infiltration of oxygen and moisture, etc. into the internal space including the pixel region can be effectively blocked. Also, the frit tinged with black is also formed on the upper part of the scan drivers adjacent to the pixel region and is thus functioned as the black matrix, improving image quality by effectively preventing the light leakage into the non-pixel region.

Although various embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light emitting display device comprising:
    a first substrate;
    a second substrate opposing the first substrate;
    an array of organic light emitting pixels interposed between the first and second substrates;
    a scan driver interposed between the first substrate and the second substrate; and
    a frit seal comprising a plurality of elongated segments interposed between the first and the second substrates, the plurality of elongated segments in combination surrounding the array, the plurality of elongated segments comprising a first elongated segment extending generally in a first direction, wherein the first elongated segment overlaps with the scan driver when viewed in a second direction from the first substrate, wherein the second direction defines the shortest distance between the first and second substrates, wherein the first elongated segment comprises a first portion and a second portion, the first portion being interposed between the scan driver and the second substrate, the second portion being interposed between the first substrate and the second substrate while not interposed between the scan driver and the second substrate, wherein the second portion comprises a first end and a second end, the first end contacting the first substrate, the second end contacting the second substrate, wherein the first end is bonded to the first substrate.

2. The device of claim 1, wherein the scan driver comprises electric circuits and a layer covering the electric circuits, wherein the first portion comprises a first end and a second end.

3. The device of claim 2, wherein at least part of the first end of the first portion contacts the layer.

4. The device of claim 2, wherein at least part of the first end does of the first portion does not contact the layer.

5. The device of claim 2, wherein at least part of the first end is not of the first portion is bonded to the layer.

6. The device of claim 2, wherein the second end of the first portion contacts and is bonded to the second substrate.

7. The device of claim 2, wherein the layer is not made of frit or glass.

8. The device of claim 2, wherein the second end of the first portion and the second end of the second portion are coplanar.

9. The device of claim 1, wherein the first and second portions from the entire first elongated segment.

10. The device of claim 2, wherein the first end of the first portion and the first end of the second portion are not coplanar.

11. The device of claim 1, wherein the first portion is located on the device on an interior surface with respect to the second portion.

12. The device of claim 1, wherein the scan driver has a portion which does not overlap with the first elongated segment when viewed from the first substrate in the second direction.

13. The device of claim 1, wherein the frit seal is configured to substantially inhibit visible light from passing therethrough.

* * * * *